United States Patent [19]

Suzuki

[11] Patent Number: 4,948,923
[45] Date of Patent: Aug. 14, 1990

[54] BOTTOM COVER INSTALLATION STRUCTURE OF A SHIELD CASE

[75] Inventor: Nobuyuki Suzuki, Miyagi, Japan
[73] Assignee: Alps Electric Co., Ltd., Tokyo, Japan
[21] Appl. No.: 368,627
[22] Filed: Jun. 20, 1989
[30] Foreign Application Priority Data Jul. 8, 1988 [JP] Japan ............................ 63-90575[U]

[51] Int. Cl.⁵ .............................................. H05K 9/00
[52] U.S. Cl. .................................. 174/35 R; 220/315
[58] Field of Search .......... 174/35 R, 35 GC, 35 MS; 361/390, 424; 220/3.8, 3.92, 3.94, 315

[56] References Cited
U.S. PATENT DOCUMENTS 4,214,360 7/1980 Tuma et al.
4,750,090 6/1988 Abe ..................................... 361/424
4,833,276 5/1989 Ito ..................................... 174/35 R Primary Examiner—Leo P. Picard
Assistant Examiner—Bot Ledynh
Attorney, Agent, or Firm—Guy W. Shoup

[57] ABSTRACT

An insulation cover attached to a shield case such that the cover substantially seals the open side of the shield case without extending beyond the edge of the shield case. The cover plate is connected to the shield case by means of a series of notches and protuberances formed along the edge of the cover plate which match with holes formed in the legs of the shield case. When the cover is attached to the shield case, the circuitry inside the shield case is protected from both contaminants during installation and short circuits when installed on a mother board.

2 Claims, 4 Drawing Sheets

BOTTOM COVER INSTALLATION STRUCTURE OF A SHIELD CASE

BACKGROUND OF THE INVENTION

This invention relates to the protection and miniaturization of the circuits placed in a shield case.

Shield cases are used to house several kinds of circuits such as voltage controlled oscillators (VCOs) used in the production of car telephones and other cordless telephones. As the cost of producing cordless telephones decreases and their popularity increases, a demand for smaller, more convenient cordless telephones arises. One of the major problems of miniaturizing cordless telephones is the reduction in size of the VCOs which is caused by the current design of the shield case insulation cover.

FIG. 5 depicts one of the earlier conventional designs for VCO units used in cordless telephones. This VCO unit as an oscillator-modulator (not illustrated in the figure) located on the inside of the box-type prior art shield case 1. Prior art shield case 1 was attached to mother board 3 by inserting four (4) prior art installation legs 2, formed on the bottom edge of the shield case 1, into the installation holes 4 in the mother board 3. During installation a prior art insulator 7, made of mica or other insulating material, was inserted between the prior art shield case 1 and the mother board 3 by aligning the holes in prior art insulator 7 with the installation holes in mother board 3, then inserting the prior art installation legs 2 on prior art shield case 1 through the prior art insulator 7 and into the mother board 3. The purpose of prior art insulator 7 is to prevent short circuits between the pattern circuit wiring 5 or the through-hole 6 and the prior art shield case 1.

The major problem with this early form of VCO was that the bottom of the shield case remained open and the interior exposed to contamination until the time it was assembled to the mother board. This allowed impurities to enter the shield case and affect the performance of the VCO. This problem was addressed by the introduction of an insulation cover which could be attached to the bottom of the shield case prior to installation. This prior art solution is shown in FIG. 6.

FIG. 6 depicts the current use of intermediary seats 8 located between the prior art installation legs 2 and the bottom edge of shield case 1. The intermediary seats 8 are somewhat larger than the installation holes 4 in the mother board 3, thereby acting both as a platform which causes a gap between the mother board 3 and the bottom edge of prior art shield cover 1, and as a wedge used to hold prior art insulator cover 9 onto the bottom of the shield case prior to installation onto mother board 3. As shown in FIG. 9, an insulation cover 9 is placed on the bottom of the prior art shield case 1, through which pass the prior art installation legs 2 and intermediary seats 8, which extends out from the bottom edge of the shield case 1 through the gap caused by intermediary seats 8.

The problem arising from the use of prior art insulator covers is that the cover can be easily bent away from the bottom of the shield case, shown in FIG. 9, thereby allowing foreign matter to enter the shield case and affect the performance of the VCO. A second problem which arises is that when the shield case is installed on the mother board, a portion of the insulation sticks out from beneath the shield case forming a perimeter. This perimeter covers space on the mother board which could be eliminated to facilitate miniaturization. Also, because the shield case design must account for the perimeter in order to attach the insulation to the shield case, the miniaturization of the shield case itself is limited.

SUMMARY OF THE INVENTION

In order to solve the problems described above, this invention introduces a thin bottom cover plate made of insulating material which fits between the installation legs of the shield case and is held in place by means of a series of protuberances which fit into matching holes made in the installation legs. The cover provides protection to the VCO during assembly. Also, because the shape of the cover plate matches the shape of the bottom edge of the shield case, there is no insulation protruding out from the bottom of the shield case when it is installed onto a mother board. This facilitates the miniaturization of cordless phones because less of the mother board space is covered by the insulation protruding from the sides of the prior art embodiment.

BRIEF DESCRIPTION OF THE DRAWINGS

FIG. 1 is a perspective view of the insulation plate attached to the shield case and the resulting assembly's orientation with the mother board, FIG. 2 shows an exploded bottom view of the shield case and bottom cover plate, FIG. 3 is a section view of the shield case showing the location of the circuit board, the bottom cover plate and the circuit board terminal, FIGS. 4 are perspective views of the relationship between the locking holes and the protuberances.

DETAILED DESCRIPTION OF THE INVENTION

The preferred embodiment of the bottom cover shield structure of a shield case is illustrated in FIGS. 1-4.

Figure 1:
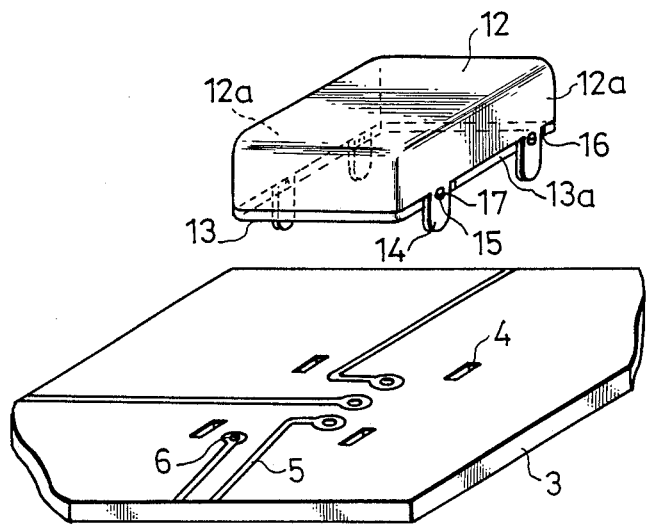
FIGS. 1 through 4 relate to the present invention, FIGS. 5 through 10 relate to prior art.

As shown in FIG. 1, the shield case 12 is an open-sided rectangular box structure having four installation legs 12 located on the edge around and pointing away from the open side. Two installation legs 14 are located on each of two opposing edges 12a. On each installation leg 14 is located a locking hole 15 which is centered along the width and located near the junction between the installation leg 14 and the edge 12a of shield case 12.

Each installation leg 14 has a corresponding installation hole 4 located on mother board 3. The alignment of shield case 12 is such that the pattern circuit wiring 5 and through-hole 6 create the proper connections with the VCO located within the shield case 12.

Figure 2:
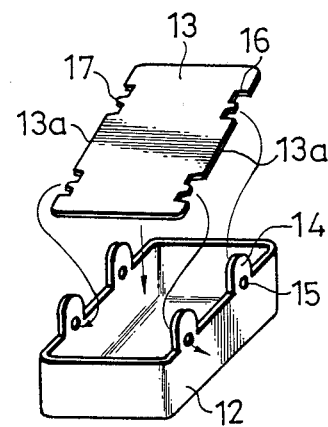

As shown in FIG. 2, the bottom cover 13 is a thin, flat piece of insulating material whose outer dimensions match the open side of shield case 12. Along the two edges of 13a of bottom cover 13 which match the two edges 12a of shield case 12 are located four connecting groves 16. Within each connecting groove is a protuberance 17. The connecting grooves 16 and protuberance 17 are paired such that when the cover plate 13 is attached to the shield case 12, the connecting grooves 16 fit snugly against the installation legs 14 and the protuberances 17 fit within the locking holes 15.

Figure 3:
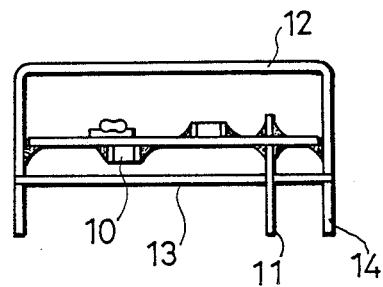
Figure 4A:
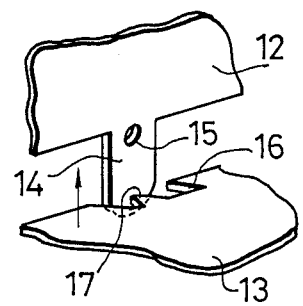
Figure 4B:
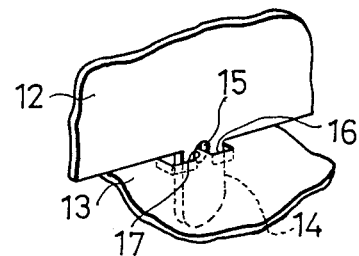
Figure 5:
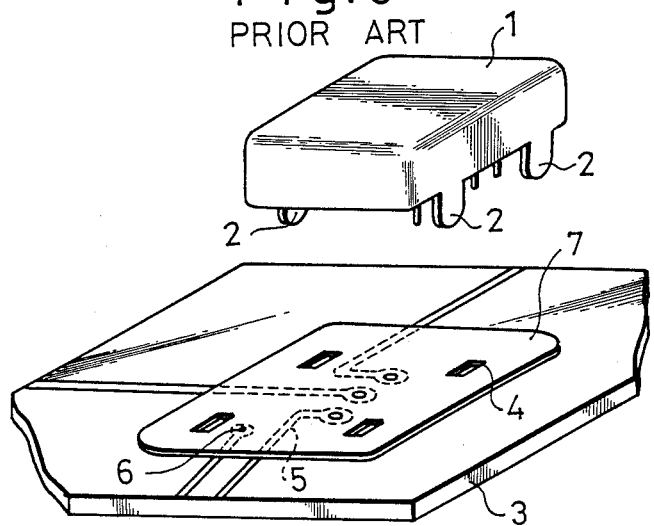
FIGS. 5 is a perspective view of an early prior art method of assembling shield cases to mother boards.
Figure 6:
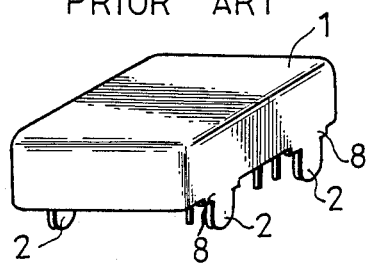
FIG. 6 is a perspective view of an advanced prior art shield case design.
Figure 7:
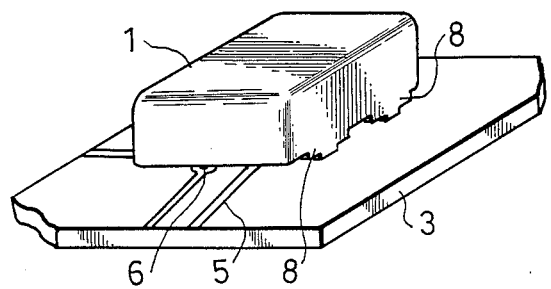
FIG. 7 is a perspective view of the advanced prior art shield case attached to the mother board.
Figure 8:
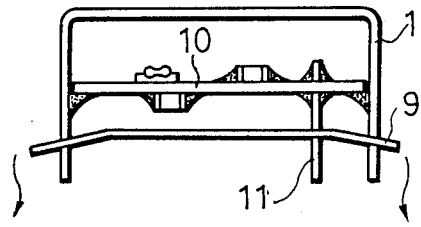
FIG. 8 is a section view showing how the prior art insulation cover can be pried open to allow impurities to enter the case.
Figure 9:
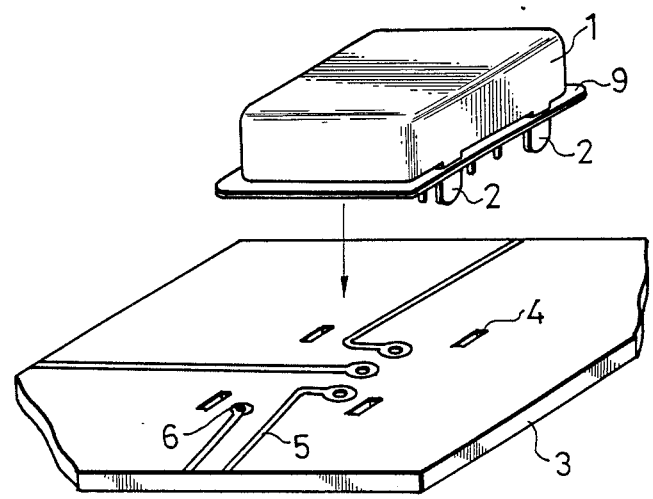
FIG. 9 is a perspective view of the installation of the advanced prior art embodiment.
Figure 10:
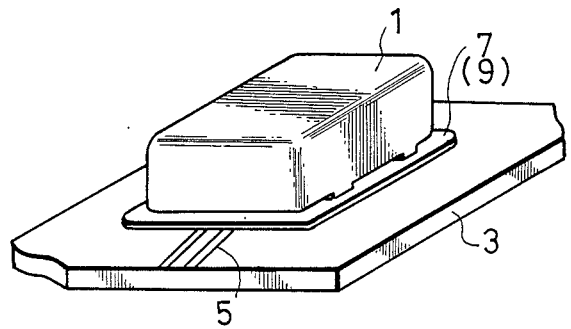
FIG. 10 is a perspective view of the installed improved prior art embodiment.

As illustrated in FIG. 4, the cover plate 13 is attached to shield case 12 by bending the installation legs 14 on opposing edges 12a away from each other, thereby creating enough clearance to insert the protuberances 17 into their corresponding locking holes 15. The installation legs 14 are then released and the elastic character of the shield case 12 material causes the legs to return to their original position. When the installation legs 14 have returned to their original position, the protuberances 17 are trapped within the locking holes 15 and, therefore, the bottom cover 13 is secured against the shield case 12. FIG. 3 illustrates a shield case with the bottom cover attached.

The bottom cover design is not limited to the description above. The number of installation legs 14 may vary depending upon the size and shape of the shield case 12. The locking holes 15 may either be completely through the installation leg 14, or may be just deep enough to accommodate the protuberance 17. Other variations may also exist. In addition, the circuit placed in the shield case 12 is not limited to a VCO.

One beneficial effect of having a bottom cover attached to a shield case as described above is to allow the shield case to be miniaturized without having to account for the insulation which protrudes from beneath the currently designed shield cases. Because the shield case and corresponding insulation cover less area of the mother board, the mother board can also be miniaturized.

Another benefit of the described bottom cover design is to prevent containments from entering the shield case during transportation before assembly to the mother board. The new design is superior to the prior art because the bottom cover, once attached, is not easily removed or bent open to allow containments to enter.

What is claimed is:

1. A shield case and cover assembly comprising:
   a hollow shield case having an open side and plurality of legs affixed to the edge of said case defining said open side, each leg defining a hole therethrough;
   a cover plate whose perimeter configuration is substantially the same as the configuration of the edge of the case defining said open side;
   the cover plate defining a plurality of notch and protuberance pairs, the number of said pairs corresponding to the number of legs of the shield case and whose placement on said cover plate are such that when each leg is positioned in a notch, each protuberance is engaged with a hole, and said cover plate covers said open side of said shield case.

2. A shield case and cover assembly of claim 1 wherein said cover plate is made of an insulating material.

* * * * *